United States Patent [19]
Rountree

[11] Patent Number: 5,682,110
[45] Date of Patent: Oct. 28, 1997

[54] LOW CAPACITANCE BUS DRIVER

[75] Inventor: Robert N. Rountree, Plano, Tex.

[73] Assignee: Texas Instruments Incorporated, Dallas, Tex.

[21] Appl. No.: 855,958

[22] Filed: Mar. 23, 1992

[51] Int. Cl.$^6$ .............................................. H03K 19/084
[52] U.S. Cl. .................... 327/108; 326/58; 326/113; 326/121
[58] Field of Search ................ 307/451–2, 270, 307/600, 605, 423

[56] References Cited

U.S. PATENT DOCUMENTS

| | | | |
|---|---|---|---|
| 4,366,556 | 12/1982 | Kyomasu et al. | 365/189 |
| 4,595,845 | 6/1986 | Briggs | 307/452 |
| 5,126,596 | 6/1992 | Millman | 307/451 |
| 5,153,459 | 10/1992 | Park et al. | 307/452 |
| 5,173,627 | 12/1992 | Lien | 307/473 |

Primary Examiner—Margaret Rose Wambach
Attorney, Agent, or Firm—Ronald O. Neerings; Jim C. Kesterson; Richard L. Donaldson

[57] ABSTRACT

A low capacitance bus driver circuit includes, in this example, P-channel and N-channel output transistors with input gates connected by means of CMOS pass gates to a common input terminal and having respective P-channel and N-channel transistors connected to the input gates of the output transistors so as to place them in a high impedance state when the CMOS pass gates are disabled. Input capacitance of the bus driver circuit is greatly reduced by elimination of CMOS gate capacitance when the bus driver is enabled. When the bus driver is not enabled, it provides optimal performance of a single gate delay from input to output without the need for series connected output devices or correspondingly higher input capacitance.

33 Claims, 2 Drawing Sheets

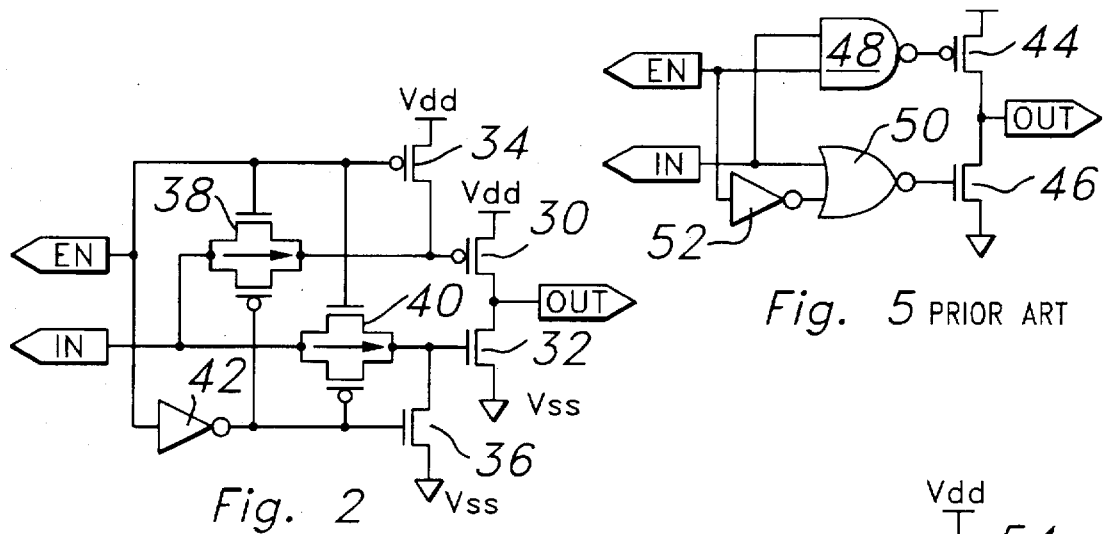
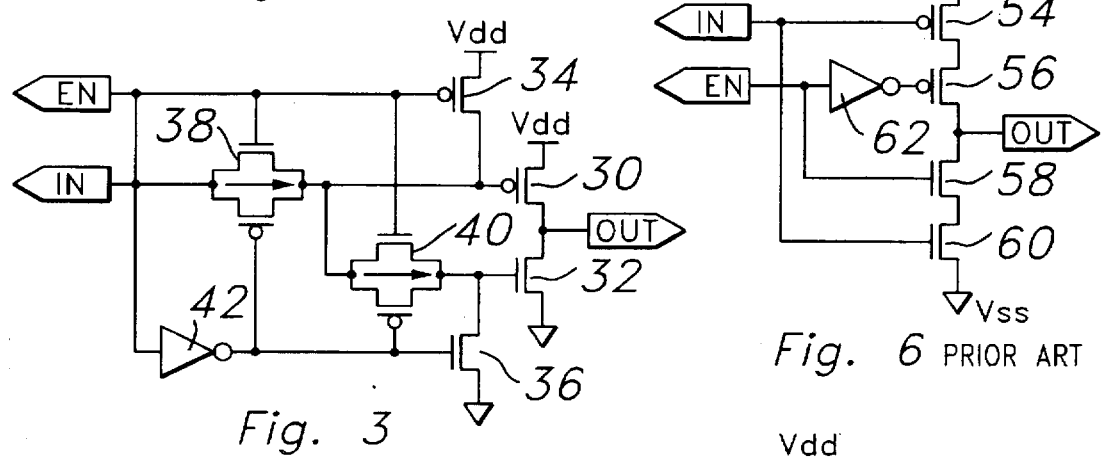
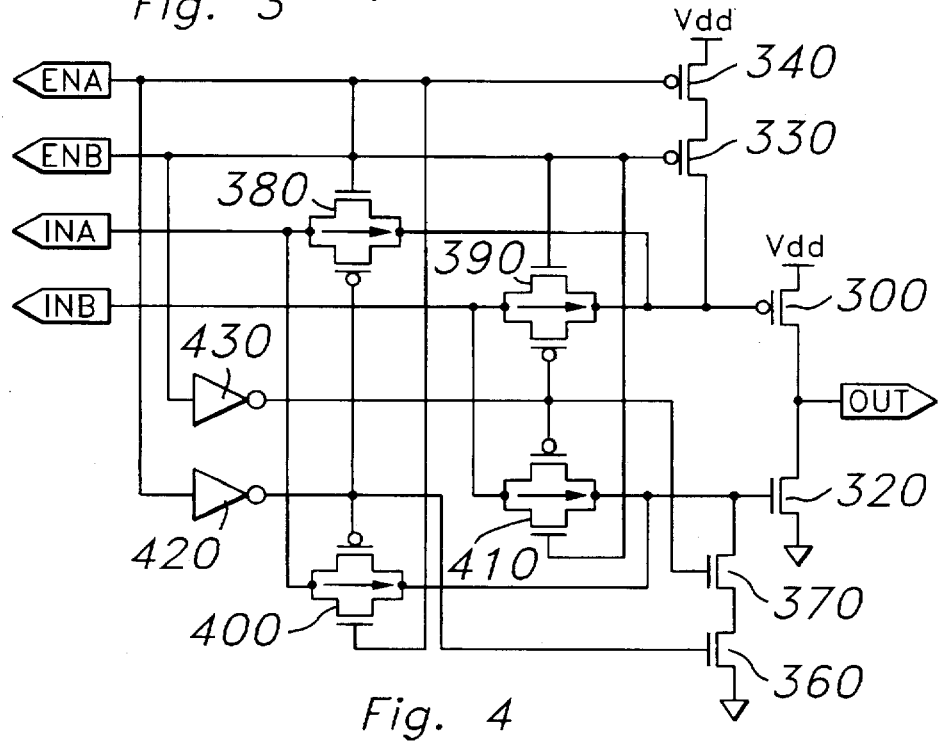

LOW CAPACITANCE BUS DRIVER

FIELD OF THE INVENTION

The present invention relates to the field of integrated circuit devices. More specifically, the present invention relates to a low capacitance bus driver for integrated circuits having bus lines for the transmission of input and output data.

BACKGROUND OF THE INVENTION

Integrated circuits formed using complementary-metal-oxide-semiconductor (CMOS) processes for logic and memory applications frequently use bidirectional bus lines for transmission of input and output data. This is especially common for applications which partition large memory circuits into many smaller arrays to conserve power and reduce access time. When an input or output operation is performed by means of a bidirectional line, one of several output amplifiers is enabled to drive data onto the line. Then at least one of several input amplifiers connected to the line is enabled to accept the data for subsequent processing.

Output amplifiers which drive data onto a bus line are typically designed to provide active high, active low, or high impedance output states such that only the selected amplifier determines the data state of the line. Additionally, they are designed to minimize gate delays between input and output terminals to increase speed. Input amplifiers are designed to minimize input capacitance, since even unselected inputs may increase the total load capacitance on the bus line. This increases power dissipation as well as the time required for data propagation along the bus line. In practice the same bus driver circuit is often used as either an input or output amplifier depending upon output or input terminal connection to the bus line.

SUMMARY OF THE INVENTION

The present invention disclosed herein comprises a low capacitance bus driver. The bus driver circuit is comprised of P-channel and N-channel output transistors with input gates connected by means of CMOS pass gates to a common input terminal and having respective P-channel and N-channel transistors connected to the input gates of the output transistors so as to place them in a high impedance state when the CMOS pass gates are disabled.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 2 is a schematic diagram of a low capacitance bus driver circuit according to one embodiment of the present invention.

FIG. 3 is a schematic diagram of a low capacitance bus driver circuit according to yet another embodiment of the present invention.

FIG. 4 is a schematic diagram of a low capacitance bus driver circuit according to still yet another embodiment of the present invention.

FIG. 5 is a bus driver circuit of prior art.

FIG. 6 is yet another bus driver circuit of prior art.

DETAILED DESCRIPTION OF PREFERRED EMBODIMENTS

Figure 1:
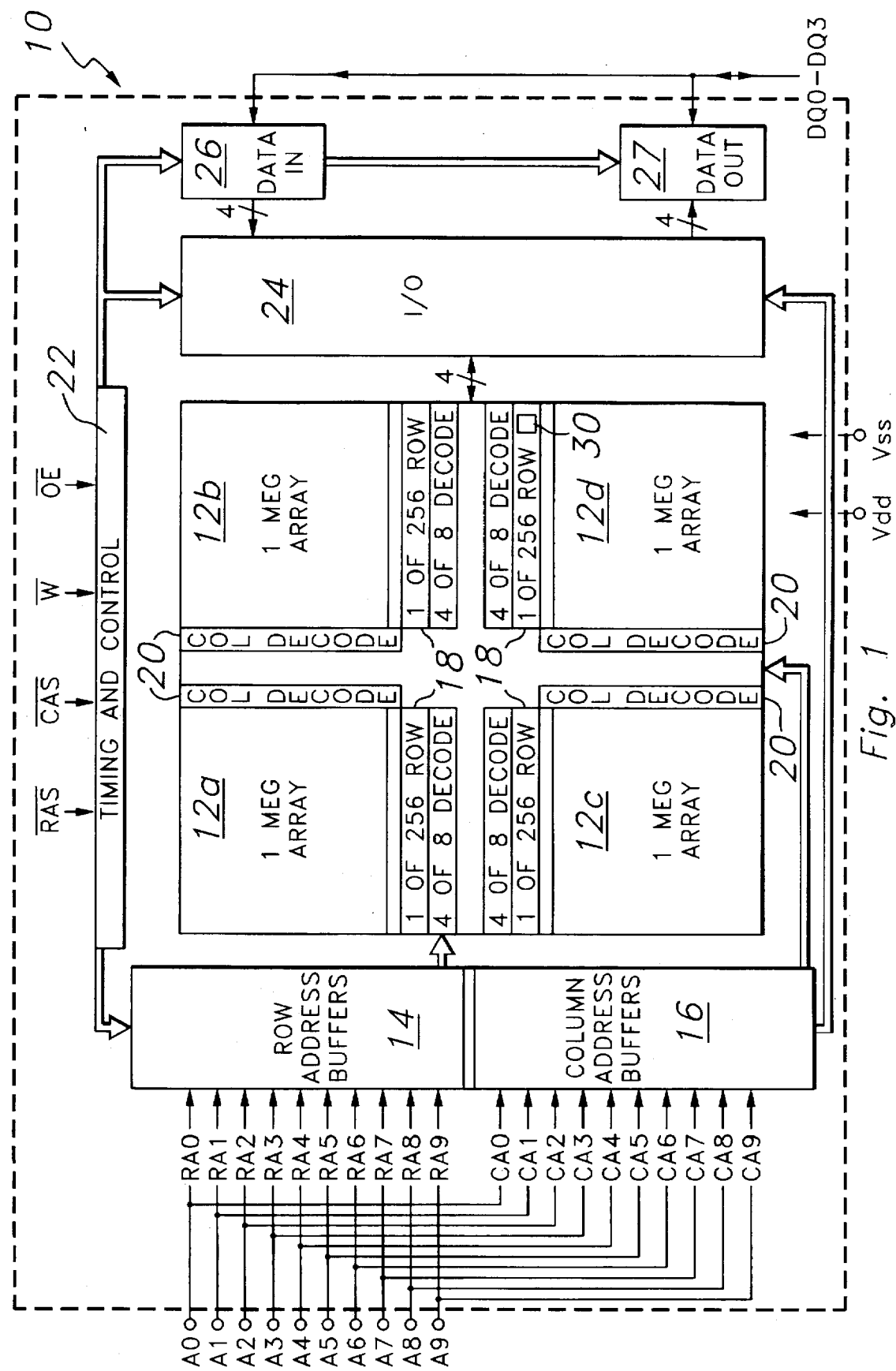
FIG. 1 is a block diagram of a memory device which may employ the low capacitance bus driver circuits of the invention.

The block diagram of FIG. 1 illustrates a semiconductor memory device with which the invention may be practiced. Exemplary device 10 is a Dynamic Random Access Memory (DRAM) of the so-called 4 megabit (MB) density. According to a preferred architecture, the device is partitioned into four identical logical data blocks 12, individually designated 12a, 12b, 12c and 12d. Each block 12 is of the one megabit size, comprising 1,048,576 memory cells arranged in an array of rows and columns.

Device 10 includes input buffers (row address buffers 14 and column address buffers 16) connected to address inputs (A0–A9 in a 1 M×4 DRAM or A0–A10 in a 4 M×1 DRAM), row decoders 18 and column decoders 20, timing and control circuitry 22 and Input/Output circuitry 24. Timing and control circuitry 22 is also connected to Input/Output 24 and Data In 26. Input/Output 24 is also connected to Data In 26 and Data out 27. The operation is controlled by RAS__, CAS__, W__ and OE__ on input pins. Power is supplied by Vdd and Vss terminals.

In a preferred embodiment of the invention, device 10 includes low capacitance bus driver circuits 28 within Input/Output 24.

Referring now to FIG. 2, there is illustrated a schematic diagram of a preferred embodiment of a low capacitance bus driver circuit of the present invention. One of a source/drain of P-channel transistor 30 is connected to a reference voltage, typically Vdd. The other of the source/drain of P-channel transistor 30 is connected to a data output line OUT and to one of a source/drain of N-channel transistor 32. The other of the source/drain of N-channel transistor 32 is connected to a reference voltage, typically Vss. One of a source/drain of P-channel transistor 34 is connected to a reference voltage, typically Vdd. The other of the source/drain of P-channel transistor 34 is connected to the gate of P-channel transistor 30, to one of a source/drain of the N-channel and one of a source/drain of the P-channel of CMOS pass gate 38.

The gate of the P-channel transistor 34, the gate of the N-channel of CMOS pass gate 38, the gate of the N-channel of CMOS pass gate 40 and the input of inverter 42 are connected to an enable signal line EN. The other of the source/drain of the N-channel and the other of the source/drain of the P-channel of CMOS pass gate 38 and one of the source/drain of the N-channel and one of the source/drain of the P-channel of CMOS pass gate 40 are connected to data input line IN. The gate of the P-channel of CMOS pass gate 38 is connected to the output of inverter 42, to the gate of the P-channel of CMOS pass gate 40 and to the gate of N-channel transistor 36. One of a source/drain of N-channel transistor 36 is connected to the other of the source/drain of the N-channel, the other of the source/drain of the P-channel of CMOS pass gate 40 and to the gate of N-channel transistor 32. The other of the source/drain of N-channel transistor 36 is connected to a reference voltage, typically Vss.

In operation, when the enable signal is low together with a complementary high enable signal generated by inverter 42, CMOS pass gates 38 and 40 are placed in a high impedance state and P-channel transistor 34 and N-channel transistor 36 are placed in a low impedance state. These complementary levels at the input gates of P-channel transistor 30 and N-channel transistor 32 result in a high impedance output state. Furthemore, the high impedance state of CMOS pass gates 38 and 40 reduces input load to that of the pass gate source and drain diffusion capacitance when the enable signal is low. When, on the other hand, the enable signal is high, transistors 34 and 36 are placed in a high impedance state and CMOS pass gates 38 and 40 become conductive so that the input gates of output transistors 30 and 32 are connected to the input signal. In this state, the bus driver requires only one gate delay from input to output.

Referring now to FIG. 3, there is illustrated a schematic diagram of another embodiment of the present invention. One of a source/drain of P-channel transistor 30 is connected to a reference voltage, typically Vdd. The other of the source/drain of P-channel transistor 30 is connected to a data output line OUT and to one of a source/drain of N-channel transistor 32. The other of the source/drain of N-channel transistor 32 is connected to a reference voltage, typically Vss. One of a source/drain of P-channel transistor 34 is connected to a reference voltage, typically Vdd. The other of the source/drain of P-channel transistor 34 is connected to the gate of P-channel transistor 30, to one of a source/drain of the N-channel and one of a source/drain of the P-channel of CMOS pass gate 38 and to one of a source/drain of the N-channel and one of a source/drain of the P-channel of CMOS pass gate 40.

The gate of the P-channel transistor 34, the gate of the N-channel of CMOS pass gate 38, the gate of the N-channel of CMOS pass gate 40 and the input of inverter 42 are connected to an enable signal line EN. The other of the source/drain of the N-channel and the other of the source/drain of the P-channel of CMOS pass gate 38 are connected to data input line IN. The gate of the P-channel of CMOS pass gate 38 is connected to output of inverter 42, to the gate of the P-channel of CMOS pass gate 40 and to the gate of N-channel transistor 36. One of a source/drain of N-channel transistor 36 is connected to the other of the source/drain of the N-channel and the other of the source/drain of the P-channel of CMOS pass gate 40 and to the gate of N-channel transistor 32. The other of the source/drain of N-channel transistor 36 is connected to a reference voltage, typically Vss.

In operation, when the enable signal is low together with a complementary high enable signal generated by inverter 42, CMOS pass gates 38 and 40 are placed in a high impedance state and P-channel transistor 34 and N-channel transistor 36 are placed in a low impedance state. These complementary levels at the input gates of P-channel transistor 30 and N-channel transistor 32 result in a high impedance output state. Furthermore, the high impedance state of CMOS pass gate 38 reduces input load to that of the source and drain diffusion capacitance of pass gate 38 when the enable signal is low. When, on the other hand, the enable signal is high, transistors 34 and 36 are placed in a high impedance state and CMOS pass gates 38 and 40 become conductive so that the input gates of output transistors 30 and 32 are connected to the input signal. In this state, the bus driver operation is equivalent to the circuit of FIG. 2.

Referring now to FIG. 4, there is illustrated a schematic diagram of yet another embodiment of the present invention. One of a source/drain of P-channel transistor 300 is connected to a reference voltage, typically Vdd. The other of the source/drain of P-channel transistor 300 is connected to a data output line OUT and to one of a source/drain of N-channel transistor 320. The other of the source/drain of N-channel transistor 320 is connected to a reference voltage, typically Vss. One of a source/drain of P-channel transistor 330 is connected to the gate of P-channel transistor 300, to one of a source/drain of the N-channel and one of a source/drain of the P-channel of CMOS pass gate 380 and to one of a source/drain of the N-channel and one of a source/drain of the P-channel of pass gate 390. The other of the source/drain of P-channel transistor 330 is connected to one of a source/drain of P-channel transistor 340. The other of the source/drain of P-channel 340 is connected to a reference voltage, typically Vdd.

The gate of P-channel 340 is connected to the first enable signal line ENA, to the gate of the N-channel of CMOS pass gate 400, to the gate of the N-channel of CMOS pass gate 380 and to the input of inverter 420. The gate of P-channel transistor 330 is connected to the second enable signal line ENB, to the gate of the N-channel of CMOS pass gate 410, to the gate of the N-channel of CMOS pass gate 390 and to the input of inverter 430.

The other of the source/drain of the N-channel and the other of the source/drain of the P-channel of CMOS pass gate 380 are connected to a first data input line INA and to one of a source/drain of the N-channel and one of a source/drain of the P-channel of CMOS pass gate 400. The other of the source/drain of the N-channel and the other of the source/drain of the P-channel of CMOS pass gate 390 are connected to a second data input line INB and to one of a source/drain of an N-channel and one of a source/drain of a P-channel of CMOS pass gate 410.

The gate of the P-channel of CMOS pass gate 380 is connected to the gate of the P-channel of CMOS pass gate 400, to the output of inverter 420 and to the gate of N-channel transistor 360. The gate of the P-channel of CMOS pass gate 390 is connected to the gate of the P-channel of CMOS pass gate 410, to the output of inverter 430 and to the gate of N-channel transistor 370. The other of the source/drain of the N-channel and the other of the source/drain of the P-channel of CMOS pass gate 410 are connected to the other of the source/drain of the N-channel and the other of the source/drain of the P-channel of CMOS pass gate 400, to one of a source drain of N-channel transistor 370 and to the gate of N-channel transistor 320. The other of the source/drain of transistor 370 is connected to one of a source/drain of N-channel transistor 360. The other of the source/drain of transistor 360 is connected to a reference voltage, typically Vss.

In operation, when the enable signals on first and second enable signal lines ENA and ENB are low together with complementary enable signals generated by inverters 420 and 430, CMOS pass gates 380, 390, 400 and 410 are placed in a high impedance state and P-channel transistors 340 and 330 as well as N-channel transistors 360 and 370 are placed in a low impedance state. These complementary levels at the input gates of P-channel transistor 300 and N-channel transistor 320 result in a high impedance output state. Furthermore, the high impedance state of all CMOS pass gates reduces the load at first and second data input lines INA and INB to that of the respective pass gate source and drain diffusion capacitance when the enable signals are low.

When the signal on the first enable signal line ENA is high and the signal on the second enable signal line ENB is low, transistors 340 and 360 are placed in a high impedance state. Although transistors 330 and 370 remain in a low impedance state, the series connection with transistors 340 and 360 respectively results in a high impedance path to the input gates of transistors 300 and 320. Correspondingly, CMOS pass gates 380 and 400 become conductive while CMOS pass gates 390 and 410 remain in a high impedance state. Therefore, first data input line INA is connected to the input gates of output transistors 300 and 320, while second data input line INB remains in a high impedance, low capacitance state. In this state, the bus driver operation is equivalent to the circuit of FIG. 2 with the output controlled by the signal on data input line INA.

For the case where the signal on the second enable signal line ENB is high and the signal on the first enable signal line ENA is low, operation of the bus driver is essentially the same, but corresponding functions are reversed so that the second data input line INB is connected to the input gates of output transistors 300 and 320, and first data input line INA remains in a high impedance, low capacitance state.

The circuit of FIG. 4 may be expanded to multiplex additional inputs with relatively little compromise of circuit functionality. Series connection of CMOS pass gates as in FIG. 4 may also be employed to further minimize source and drain diffusion capacitance at the input terminals.

Referring to FIG. 5, there is illustrated a bus driver of prior art comprised of P-channel output transistor 44 with input gate driven by NAND gate 48 and N-channel output transistor 46 with input gate driven by NOR gate 50, having inverter 52 to provide a complementary enable signal. When the enable signal passed to gate 48 and inverter 52 is low, both of output transistors 44 and 46 are placed in a high impedance state by the outputs of gate 48 and inverter 52. When the enable signal is high, gates 48 and 50 are both enabled, and their output levels depend upon the common input level. If the input is low, the outputs of gates 48 and 50 are both high. This places transistor 44 in a high impedance state and transistor 46 in a low impedance state thereby resulting in a low output level. Conversely, if the input is high, transistor 44 is in a low impedance state and transistor 46 is in a high impedance state resulting in a high output level. The driver, therefore, requires 2 gate delays from input to output, and the capacitive load of gates 48 and 50 is present at the input for either state of the enable signal.

Referring now to FIG. 6, there is illustrated another bus driver of prior art comprising P-channel output transistors 54 and 56, N-channel output transistors 58 and 60, and inverter 62 to provide a complementary enable signal. When the enable signal passed to transistor 58 and inverter 62 is low, transistors 56 and 58 are in a high impedance state. When the enable signal is high, transistors 56 and 58 are in a low impedance state so that the output is an inversion of the input level connected to transistors 54 and 56. The bus driver only requires one gate delay from input to output. Since transistors 54 and 56 are connected in series as are transistors 58 and 60, a width equal to twice that of transistors 44 and 46 respectively (FIG. 5) would be required to provide equivalent drive strength. The greater width requirement of transistors 54 and 60 leads to a correspondingly greater input capacitance than the bus driver of FIG. 5 for either state of the enable signal.

Thus, the advantage of present invention is that the bus driver requires only one gate delay from input to output and has equivalent drive strength to the bus driver of FIG. 5 without the input capacitance load of the bus driver of FIG. 6.

In summary, a bus driver circuit according to a preferred embodiment of the invention supplies either a high or low output level or a high impedance state. Input capacitance of the bus driver is greatly reduced by elimination of CMOS gate capacitance when the bus driver is not enabled. When the bus driver is enabled, it provides optimal performance of a single gate delay from input to output without the need for series connected output devices or correspondingly higher input capacitance when enabled.

While this invention has been described with reference to an illustrative embodiment, this description is not to be construed in a limiting sense. For example, while the low capacitance bus driver circuit of the invention has been described in the input/output section of a 4 M DRAM, it can be used in other sections of the 4 M DRAM, other DRAMs, other memory device or non-memory devices. Indeed, the low capacitance bus driver circuit can be used in a variety of circuits where it is necessary to amplify a signal and drive a large capacitive load. Various modification to the illustrative embodiment, as well as other embodiments of the invention will be apparent to persons skilled in the art upon reference to this description. It is therefore contemplated that the appended claims will cover any such modifications or embodiments as fall within the true scope of the invention.

What is claimed:

1. A circuit, comprising:
   a first transistor and a second transistor, one of a source/drain of said first transistor and one of a source/drain of said second transistor connected to an output terminal;
   a first CMOS pass gate coupling a common input terminal to a gate of said first transistor;
   a second CMOS pass gate coupling said common input terminal to a gate of said second transistor; and
   a switching circuit coupled to the gates of said first and second transistors for placing said first and second transistors in a high impedance state when said CMOS pass gates are disabled, said switching circuit comprising:
   an inverter having an input and an output, the input coupled to receive an enable signal;
   a third transistor, one of a source/drain of said third transistor connected to a first reference voltage terminal, the other of the source/drain of said third transistor connected to the gate of said first transistor, a gate of said third transistor connected to a first control terminal of said first CMOS pass gate and connected to a first control terminal of said second CMOS pass gate and coupled to receive an enable signal; and
   a fourth transistor, one of a source/drain of said fourth transistor connected to the gate of said second transistor, the other of the source/drain of said fourth transistor connected a second reference voltage terminal, a gate of said fourth transistor connected to a second control terminal of said first CMOS pass gate and connected to a second control terminal of said second CMOS pass gate and connected to the output of the inverter.

2. The circuit of claim 1 in which said first transistor is a P-channel transistor.

3. The circuit of claim 1 in which said second transistor is an N-channel transistor.

4. The circuit of claim 1 in which inputs of said first and second CMOS pass gates are connected to said common input terminal and an output of said first CMOS pass gate is connected to the gate of said first transistor and an output of said second CMOS pass gate is connected to the gate of said second transistor.

5. The circuit of claim 1 in which an input of said first CMOS pass gate is connected to said common input terminal, an output of said first CMOS pass gate is connected to the gate of said first transistor, an input of said second CMOS pass gate is connected to the output of said first CMOS pass gate and an output of said second CMOS pass gate is connected to the gate of said second transistor.

6. The circuit of claim 1 in which said third transistor is a P-channel transistor and said fourth transistor is an N-channel transistor.

7. The circuit of claim 1 in which said first reference voltage is Vdd and said second reference voltage is Vss.

8. A circuit, comprising:

a first transistor and a second transistor, one of a source/drain of said first transistor and one of a source/drain of said second transistor connected to an output terminal;

a first CMOS pass gate coupling a first common input terminal to a gate of said first transistor;

a second CMOS pass gate coupling said first common input terminal to a gate of said second transistor;

a third CMOS pass gate coupling a second common input terminal to the gate of said first transistor;

a fourth CMOS pass gate coupling said second common input terminal to the gate of said second transistor; and a switching circuit coupled to the gates of said first and second transistors for placing said first and second transistors in a high impedance state when said CMOS pass gates are disabled.

9. The circuit of claim 8 in which the switching circuit comprises a third transistor, a fourth transistor, a fifth transistor, a sixth transistor, said first inverter and a second inverter;

one of a source/drain of said third transistor connected to a first reference voltage terminal, the other of the source/drain of said third transistor connected to one of a source/drain of said fourth transistor, the other of the source/drain of the fourth transistor connected to the gate of said first transistor;

one of a source/drain of said fifth transistor connected to said gate of said second transistor, the other of the source/drain of said fifth transistor connected to one of a source/drain of said sixth transistor, the other of the source/drain of said sixth transistor connected to a second reference supply voltage terminal;

a first inverter having an input coupled to a first control terminal of said first CMOS pass gate, a first control terminal of said second CMOS pass gate and a gate of said third transistor, the input of the first inverter coupled to receive a first enable signal;

a second inverter having an input coupled to a first control terminal of said third CMOS pass gate, a first control terminal of said fourth CMOS pass gate and a gate of said fourth transistor, the input of the second inverter coupled to receive a second enable signal;

an input of said first CMOS pass gate and an input of said second CMOS pass gate connected to said first common input terminal, an input of said third CMOS pass gate and an input of said fourth CMOS pass gate connected to said second common input terminal, an output of said first CMOS pass gate connected to the gate of said first transistor and to an output of said third CMOS pass gate, an output of said second CMOS pass gate connected to the gate of said second transistor and to an output of said fourth CMOS pass gate; and an output of said first inverter connected to second control terminals of said first and second CMOS pass gates and to a gate of the sixth transistor, an output of said second inverter connected to second control terminals of said third and fourth CMOS pass gates and to a gate of the fifth transistor.

10. The device of claim 9 in which said first reference voltage is Vdd and said second reference voltage is Vss.

11. A low capacitance bus driver circuit providing a single gate delay from input to output, comprising:

first and second output transistors connected to said output;

a first control transistor having a current path coupled between a first voltage supply terminal and a control terminal of the first output transistor;

a second control transistor having a current path coupled between a second voltage supply terminal and a control terminal of the second output transistor;

at least two pass gates coupling said input to the control terminals of said first and second output transistors; and means to select or deselect said circuit, said deselect providing a high impedance output by enabling the current paths of the first and second control transistors when the at least two pass gates are disabled.

12. The circuit of claim 11, in which said pass gates are CMOS pass gates.

13. The circuit of claim 11, in which said first and second output transistors are P-channel and N-channel transistors, respectively.

14. A circuit, comprising:

an input terminal;

an output terminal connected to first and second output transistors;

a first control transistor having a control gate and a current path, the current path coupled between a first voltage supply terminal and a control gate of the first output transistor;

a second control transistor having a control gate and a current path, the current path coupled between a second voltage supply terminal and a control gate of the second output transistor;

a first pass gate coupled between the input terminal and the control gate of the first output transistor, the first pass gate having a control terminal coupled to the control gate of the first control transistor for disabling the first control transistor when the first pass gate is enabled, responsive to a first control signal; and a second pass gate coupled between the input terminal and the control gate of the first output transistor, the second pass gate having a control terminal coupled to the control gate of the second control transistor for disabling the second control transistor when the second pass gate is enabled, responsive to a second control signal.

15. The circuit of claim 14, in which said pass gates are CMOS pass gates.

16. The circuit of claim 14, in which said first and second output transistors are P-channel and N-channel transistors, respectively.

17. A circuit as in claim 14 having only one signal inversion between the input terminal and the output terminal.

18. A circuit, comprising:

a first input terminal;

a second input terminal;

an output terminal connected to first and second output transistors;

a first set of at least two pass gates coupling said first input terminal to control terminals of said first and second output transistors;

a second set of at least two pass gates coupling said second input terminal to said control terminals of said first and second output transistors; and a means to select or deselect said circuit.

19. The circuit of claim 18, in which said first and second sets of pass gates are CMOS pass gates.

20. The circuit of claim 18, in which said first and second output transistors are P-channel and N-channel transistors, respectively.

21. The circuit of claim 18 wherein said deselect provides a high impedance output.

22. A circuit as in claim 18 having only one signal inversion between the first input terminal and the output terminal and having only one signal inversion between the second input terminal and the output terminal.

23. A circuit, comprising:

a circuit having an input terminal, an output terminal and a single signal inversion between said input terminal and said output terminal; and means to select or deselect said circuit, said means reducing an input load and causing said output terminal logo into a high impedance or non-conductive state when said circuit is deselected.

24. A method, comprising:

providing an input terminal;

providing an output terminal connected to first and second output transistors;

providing a control circuit for coupling a control gate of said first output transistor to a first voltage supply terminal and for coupling a control gate of said second output transistor to a second voltage supply terminal, responsive to a control signal;

providing at least two pass gates for coupling said input terminal to control terminals of said first and second output transistors without intervening signal inversions, responsive to the control signal;

applying a first state of the control signal to enable the first and second output transistors by disabling the control circuit and enabling the at least two pass gates; and applying a second state of the control signal to disable the first and second output transistors by enabling the control circuit and disabling the at least two pass gates.

25. A drive circuit, comprising:

a switching circuit having a current path and a control terminal, the current path coupled to an input terminal, the current path conducting, responsive to a first state of a control signal applied to the control terminal;

an inverting circuit having an input terminal and an output terminal, the input terminal coupled to the current path; and a control circuit for disabling the inverting circuit, responsive to a second state of the control signal, the drive circuit providing a only one signal inversion between the input terminal and the output terminal.

26. A drive circuit as in claim 25, wherein the switching circuit comprises a plurality of pass gates.

27. A drive circuit as in claim 26, wherein each of the plurality of pass gates is a CMOS pass gate.

28. A drive circuit as in claim 27, wherein each CMOS pass gate further comprises a P-channel transistor and an N-channel transistor, the P-channel transistor having a current path connected in parallel a current path of the N-channel transistor.

29. A drive circuit as in claim 26, wherein the inverting circuit comprises a first output transistor and a second output transistor, the first output transistor coupled between a voltage supply terminal and the output terminal, the second output transistor coupled between the output terminal and a reference supply terminal.

30. A drive circuit as in claim 29, wherein the control circuit comprises first and second control transistors, each of the first and second control transistors having a current path coupled to a gate of the first and second output transistor, respectively, for disabling the inverting circuit, responsive to the second state of the control signal.

31. A drive circuit as in claim 30, wherein the first output transistor is a P-channel transistor and the second output transistor is an N-channel transistor.

32. A drive circuit as in claim 31, wherein the first control transistor is a P-channel transistor and the second control transistor is an N-channel transistor.

33. A drive circuit as in claim 30, wherein a capacitance of the inverting circuit and the switching circuit comprises a first load capacitance at the input terminal, responsive to the first state of the control signal, and a diffusion capacitance of the switching circuit comprises a second load capacitance at the input terminal, responsive to the second state of the control signal.

* * * * *

UNITED STATES PATENT AND TRADEMARK OFFICE
CERTIFICATE OF CORRECTION

PATENT NO. : 5,682,110
DATED : October 28, 1997
INVENTOR(S) : Rountree

Page 1 of 1

It is certified that error appears in the above-identified patent and that said Letters Patent is hereby corrected as shown below:

Title page,
Item [56], paragraph, after  4,595,845  6/1986  Briggs......307/452, insert "4,855,623  8/1989  Flaherty ...... 307/475".

Signed and Sealed this

Eighteenth Day of December, 2001

Attest:

Attesting Officer

JAMES E. ROGAN
Director of the United States Patent and Trademark Office